(12) United States Patent
Cooper et al.

(10) Patent No.: US 8,383,316 B2
(45) Date of Patent: Feb. 26, 2013

(54) RESISTS FOR LITHOGRAPHY

(75) Inventors: Gregory D. Cooper, Arlington, VA (US); Zhiyun Chen, Silver Spring, MD (US); Z Serpil Gonen Williams, Lanham, MD (US); Larry F. Thompson, Henly, TX (US)

(73) Assignee: Pixelligent Technologies, LLC, Baltimore, MD (US)

( * ) Notice: Subject to any disclaimer, the term of this patent is extended or adjusted under 35 U.S.C. 154(b) by 1081 days.

(21) Appl. No.: 11/774,171

(22) Filed: Jul. 6, 2007

(65) Prior Publication Data

US 2008/0176166 A1    Jul. 24, 2008

Related U.S. Application Data

(60) Provisional application No. 60/806,877, filed on Jul. 10, 2006, provisional application No. 60/870,795, filed on Dec. 19, 2006.

(51) Int. Cl.
| | |
|---|---|
| G03F 7/004 | (2006.01) |
| G03F 7/213 | (2006.01) |
| G03F 7/22 | (2006.01) |
| G03F 7/30 | (2006.01) |
| G03C 1/725 | (2006.01) |

(52) U.S. Cl. ............ 430/270.1; 430/325; 430/326; 430/394; 430/914; 430/926; 430/942

(58) Field of Classification Search .......... None
See application file for complete search history.

(56) References Cited

U.S. PATENT DOCUMENTS

| | | | |
|---|---|---|---|
| 4,253,728 A | 3/1981 | Venkatesan et al. | |
| 4,698,238 A | 10/1987 | Hayasaka et al. | |
| 5,187,715 A | 2/1993 | Weisbuch et al. | |
| 5,281,840 A | 1/1994 | Sarma | |
| 5,739,898 A | 4/1998 | Ozawa et al. | |
| 6,005,707 A | 12/1999 | Berggren et al. | |
| 6,291,110 B1 | 9/2001 | Cooper et al. | |
| 6,291,145 B1 | 9/2001 | Kokubo et al. | |
| 6,440,637 B1 | 8/2002 | Choi et al. | |
| 6,455,103 B1 | 9/2002 | Mennig et al. | |
| 6,806,026 B2 * | 10/2004 | Allen et al. | 430/270.1 |
| 6,819,845 B2 | 11/2004 | Lee et al. | |
| 6,826,144 B1 | 11/2004 | Ichihara et al. | |
| 6,927,002 B2 | 8/2005 | Hattori et al. | |
| 7,524,616 B2 * | 4/2009 | Chen et al. | 430/311 |
| 2002/0027647 A1 | 3/2002 | Cooper et al. | |
| 2002/0182541 A1 | 12/2002 | Gonsalves | |

(Continued)

FOREIGN PATENT DOCUMENTS

| | | |
|---|---|---|
| CN | 1303358A A | 7/2001 |
| JP | 6-291009 | 10/1994 |

(Continued)

OTHER PUBLICATIONS

Wu et al ("Two-Photon Lithography for Microelectronic Application", Proceedings of SPIE, vol. 1674, p. 776-782 (1992)).*

(Continued)

*Primary Examiner* — Sin J. Lee

(74) *Attorney, Agent, or Firm* — Nixon & Vanderhye P.C.

(57) ABSTRACT

New routes involving multi-step reversible photo-chemical reactions using two-step techniques to provide non-linear resist for lithography are described in this disclosure. They may provide exposure quadratically dependant on the intensity of the light. Several specific examples, including but not limited to using nanocrystals, are also described. Combined with double patterning, these approaches may create sub-diffraction limit feature density.

109 Claims, 7 Drawing Sheets

U.S. PATENT DOCUMENTS

| | | | |
|---|---|---|---|
| 2002/0185634 | A1 | 12/2002 | Marder et al. |
| 2003/0099897 | A1* | 5/2003 | Fedynyshyn ............ 430/192 |
| 2003/0117598 | A1 | 6/2003 | Case et al. |
| 2003/0128347 | A1 | 7/2003 | Case et al. |
| 2003/0129545 | A1 | 7/2003 | Kik et al. |
| 2004/0152011 | A1 | 8/2004 | Chen et al. |
| 2005/0147920 | A1* | 7/2005 | Lin et al. ............... 430/311 |
| 2005/0156147 | A1 | 7/2005 | Akiba et al. |
| 2005/0173682 | A1 | 8/2005 | Zhang et al. |
| 2005/0254035 | A1 | 11/2005 | Frankel |
| 2006/0028634 | A1 | 2/2006 | Tuberfield et al. |
| 2006/0098181 | A1 | 5/2006 | Case et al. |
| 2007/0258071 | A1 | 11/2007 | Case et al. |

FOREIGN PATENT DOCUMENTS

| | | |
|---|---|---|
| JP | 2001-057329 A | 2/2001 |
| WO | WO03-009058 A2 | 1/2003 |
| WO | WO2005029180 A2 | 3/2005 |
| WO | WO2005 029180 A2 | 3/2005 |

OTHER PUBLICATIONS

Kuebler et al ("High-sensitivity Material Systems for Two-photon three-dimensional Microfabrication", Proceedings of SPIE—The International Society for Optical Engineering (2004), vol. 5347, p. 111-117).*

Internet article "Negative e-beam resist SAL603-0.45" (date unknown).*

Martiradonna et al ("Nanopositioning of Colloidal Nanocrystal Emitters by Means of Photolithography and E-beam Lithography", Physica Status Solidi, vol. 243 (15), p. 3972-3975 (2006)).*

J.C. Scaiano et al., "Photochemistry of Organic Reaction Intermediates: Novel Reaction Paths Induced by Two-Photon Laser Excitation," Acc. Chem. Res. 1988, 21, 22-29 (1988).

Wu, En-Shinn et al., "Two-Photon lithography for microelectronic application," Proc. SPIE vol. 1674, p. 776-782, Optical/Laser Microlithography V., John D. Cuthbert: Ed. (1992).

Sugita, Kazuyuki et al., Photodegradation mechanism of phenyl isopropenyl ketone—methyl methacrylate copolymers in the solid phase and their performance as a deep UV resist, Can. J. Chem. 73: 1841-1848 (1995).

Simburger, H. et al., "Photoreactions in polymers containing benzil units: a comparative study under excimer laser and Hg-lamp irradiation," Polymer 41 7883-7897 (2000).

Extended European Search Report and written opinion of the Examiner issued in corresponding European patent application 07 796 704.0 (Oct. 21, 2009).

International Search Report and Written Opinion issued in corresponding PCT application PCT/US07/15539 (Jun. 16, 2008).

Ooki, Hiroshi et al., "Experimental study on non-linear multiple exposure method," SPIE vol. 3051, pp. 85-93, Santa Clara, California (Mar. 12-14, 1997).

Shibuya, Masato et al., "Performance of Resolution Enhancement Technique Using Both Multiple Exposure and Nonlinear Resist," Jpn. J. Appl. Phys. vol. 33 (1994), pp. 6874-6877, Part I, No. 12B (Dec. 1994).

Brus, L.E,. J. Chem. Phys., 79(11), "A simple model for the ionization potential, electron affinity, and aqueous redox potentials of small semiconductor crystallites," 5566-71 (Dec. 1, 1983).

Efros, AI.L et al., "Interband absorption of light in a semiconductor sphere," Sov. Phys. Semicon.,16:772-78 (Jul. 1982).

Empedocles, S.A. et al., "Quantum-Confined Stark Effect in Single CdSe Nanocrystallite Quantrun Dots," Science, 278, 2114 (Dec. 19, 1997).

Gribkovskii , P., V.A. Zyulkov, a.E. Kazachenko, and S.A. Tikhomirov, "Optical/Nnonlinearity of Semiconductor Microcrystal $CdS_xSe_{1-x}$ Under the Action of Picosecond and Nanosecond Llaser Pulses", 1988, Phys. Stat. Sol. (b) 158: 359-66 (1988).

Kageshima, H. et al., "InGaAs/GaAs photorefractive multiple quantum well device in quantum confined Stark geometry." Appl. Phys. B 72, 685-689 (2001).

Kornowski, A. et al., "Preparation and Photophysics of Strongly Luminescing $Cd_3P_2$ Quantum Dots", J. Phys. Chem, 1996, 100: 12467-71 (1996).

Murray, C.B. et al., "Sythesis and Characterization of Monodisperse Nanocrystals and Closed-Packed Nanocyrstal Assemblies," Annu. Rev. Mater. Sci., 30:545-610 (2000).

Nagase, et al., "Super-Resolution Effect of Semiconductor-Doped Glass," Jpn. J. Appl. Phys. vol. 38 (1999), pp. 1665-1668, Part 1, No. 3B (Mar. 1999).

Noharet, Bertrand, "Harnessing light with semiconductor Spatial Light Modulators," Aperturen—Surfaces and Imaging, vol. 1-2001, pp. 12-13, XP002363385 (2001).

Nomura, S. et al., "Clearly resolved exciton peaks in $CdS_xSe_{1-x}$ microcrystallites by modulation spectroscopy", Sol. Stat. Comm., 73: 425-9 (1990).

Scalfani, A. et al., "Effect of silver deposits on the photocatalytic activity of titanium dioxide samples for the dehydrogenation or oxidation of 2-propanol," J. Photochem. Photobiol. A: Chem. 1991, 59, 181 (1991).

Zimin, L.G. et al., "Room-temperature Optical Nonlinearity in Semiconductor-doped Glasses", Phys. Stat. Sol. (b) 150:653-6 (1988).

Kambe et al., "Refractive Index Engineering of Nano-Polymer Composites," NanoGram Corporation, Fremont, CA and SRI International, Chemical Science and Technology Lab, Menlo Park, CA (Spring 2001).

Office Action issued in corresponding Chinese Patent Application 200480012054.4, including English language translation (Oct. 31, 2008).

Belfield et al., "Multiphoton-absorbing organic materials for microfabrication, emerging optical applications and non-destructive three-dimensional imaging," J. Phys. Org. Chem. 13, pp. 837-849, 2000.

* cited by examiner a) Linear Resist      b) Two-photon Resist

RESISTS FOR LITHOGRAPHY

CROSS-REFERENCE TO RELATED APPLICATION

This application claims the benefit of priority from provisional patent application no. 60/806,877 filed Jul. 10, 2006 and provisional application no. 60/870,795 filed Dec. 19, 2006; both of which are incorporated by reference herein.

TECHNICAL FIELD

The technology herein relates to $I^2$ resists for lithography processes. More particularly, the technology herein relates to a new concept regarding multi-step photo reactions to offer quadratic dependence to the exposure intensity. Still more particularly, non-limiting aspects of the technology herein relate to providing two-photon or multi-photon absorption with Auger recombination processes and to semiconductor nanocrystals.

BACKGROUND AND SUMMARY

Lithography and Resist

Lithography is used to transfer an image or a pattern from a mask onto a substrate. One example use of lithography is to manufacture semiconductor devices such as integrated circuits. Since 1971, advances in lithography have allowed integrated circuit (IC) manufacturers to reduce minimum feature sizes from 10-20 microns down to 65 nanometers in 2006. This steady miniaturization has enabled improvements in IC performance and growth in the semiconductor industry.

An example optical lithography system includes a light source, a mask, a projecting optical system and a resist coated substrate. Light passed through the mask (e.g., a quartz substrate with chrome patterns on one surface) is collected by the projecting optical system to form a reduced image on the resist. The resist changes its chemical properties when exposed to the light. After developing, an identical or complementary pattern of the mask is transferred to the resist. Further processing, such as etching as one example, translates the pattern onto the substrate underneath. By repeating this technique several times using different masks, multi-layered structures (e.g., a silicon or other material based integrated circuit) can be manufactured.

Generally, resists of the type used for lithography are thin film materials that change solubility upon exposure to actinic radiation. Resists can be used as a mask to create a three dimensional structure. This process can be used to manufacture electronic devices. There are, in general, two broad families of resists: negative and positive. Negative resists become less soluble on exposure (i.e. the exposed area remains after treatment with an appropriate solvent, developer). Positive resists become more soluble after exposure (i.e. the exposed resist is removed by the developer). Within each of these two resist classifications, many different resists have been used over time. There are many chemical mechanisms that are known for both types.

Commercially available resists generally have several properties including for example:

Adequate sensitivity to the actinic radiation—Each exposure technology uses a radiation source that has a finite energy and/or intensity. The sensitivity of the resist allows the exposure system to operate at sufficient throughput.

Resolution—Each exposure technology is developed to produce features useful to manufacture devices with defined minimum features (three dimensional structures). The resist is able to resolve these features with good process latitude.

Adhesion—The resist is a thin film that is spin coated onto a device surface. The resist adheres to the surface satisfactorily to allow subsequent processing of the underling thin film.

Etch resistance—Most device processes involve the removal of selected portions of a thin film that is not protected by the resist. The resist "resists" whatever process is used to create the final, desired, pattern, viz. liquid etching, plasma etching, ion etching etc.

Low defect density—The resist preferably should not introduce additional (within reason) defects in the thin film.

The ability to use "safe processing chemicals" such as spinning solvent, developers, etc.

Ease of manufacture.

Adequate shelf life.

Multiple chemical mechanisms have been utilized for both positive and negative resists. Some interesting negative resist mechanisms include cross-linking and molecular weight increase. For example, when a polymer is cross-linked, it becomes insoluble in common organic solvents. If the cross-linking can be induced by exposure to radiation, the material may be used as a resist to pattern thin films used in the manufacture of electronic devices. One non-limiting example is the electron beam resist COP, a copolymer of glycidyl methacrylate and ethyl acrylate. Cross-linking occurs through the epoxy moiety. Another negative resist is based on crosslinking of cyclized poly(cis-isoprene) with bis(arylazide). In addition, solubility of a polymer is generally related to the molecular weight of the polymer. As the molecular weight increases, the solubility decreases. Poly(p-hydroxystyrene) (PHOST), when formulated with bis(arylazide), undergoes a radiation induced molecular weight increase, resulting in decreased solubility. The material can be made sensitive to a wide range of radiation wavelengths by modifying the structure of the bis(arylazide).

Example positive resist mechanisms include mechanisms such as:

Chain scission—Most polymers crosslink as a result of irradiation; however, a few undergo chain scission and a reduction in molecular weight. The lower molecular weight allows the exposed polymer to be selectively dissolved in an appropriate solvent (developer). Poly (methyl methacrylate) (PMMA) is a well known polymer that undergoes chain scission and has been widely used as an electron beam resist. The sensitivity of PMMA is to low to be used in manufacture. Another family of polymers, poly(olefin sulfones) exhibit~10× greater sensitivity than PMMA and poly(butene-sulfone) has been used for a long time as an electron beam resist in the manufacture of photomasks.

Chemical amplification—Very sensitive positive resist based on chemical amplification have been developed. Example processes typically involve photo-generation of an acidic species (some base catalyzed systems have been described) that catalyzes many subsequent reactions such as de-blocking of a protective groups that are chemically bound to a matrix polymer. One such system is based on a matrix resin, poly(4-t-butoxycarbonylstyrene) (TBS) and arylsulfonium or iodonium salts. Radiation is used to generate an acid which in turn removes the t-butoxycarbonyl resulting in the base soluble poly(vinylalcohol). One acid group causes up to several hundred de-protection events, thus amplifying the desired reaction. These materials and derivatives thereof are in wide spread use as the resist of choice in deep—UV (248 nm & 193 nm) lithography.

All resists used in the current production are linear resist, they can not generate patterns smaller than the diffraction limit allows. A non-linear resist combined with double or multiple patterning is needed to created sub-diffraction limit patterns.

Two-Photon Resist and Multi-Photon Resist

In a quantum system with two levels, initial level $E_1$, and final level $E_2$, a photon having energy $E_2-E_1$ can be absorbed, promoting an electron from $E_1$ to $E_2$, in a one photon absorption process. Also, a less likely process, called two-photon absorption, can occur. In this process, two photons with energy $(E_2-E_1)/2$ can be absorbed simultaneously. A two-photon absorption process has smaller probability than a one-photon process because it requires a simultaneous presence of two photons at same location. Likewise, three-photon, four-photon, and multi-photon can be absorbed with decreasing probability.

In a two-photon absorption $$\frac{dI}{dx} = -\beta I^2 \quad (1)$$

where I is the intensity of the beam and $\beta$ is defined as the two-photon absorption coefficient to parallel the one photon, or linear, absorption regime:

$$\frac{dI}{dx} = -\alpha I \quad (2)$$

where a is the one photon absorption coefficient.

The two-photon absorption cross section is defined through the absorption rate:

$$R = \delta I^2 \quad (3)$$

Note here I is the number density of photon (number of photons per second per unit area) and $\delta$ the two-photon absorption cross section.

Wu et al. proposed a two-photon resist used in optical lithography. See E. S. Wu, J. H. Strickler, W. R. Harrell, and W. Webb, Proc. SPIE 1674, 776(1992). In a two-photon resist, the photo sensitizer in the resist will only be exposed through a two photon absorption process. Due to the quadratic dependence to the intensity, the two-photon resist is capable of creating sharpened features in the resist. As evidenced by the normalized exposure profile shown by in FIG. 1. A standard testing pattern in lithography is lines and spaces created by two interference plane waves. At the diffraction limit, the light intensity distribution at the resist can be expressed as:

$$I = 1 + \cos\left(\frac{4\pi NA}{\lambda}x\right) \quad (4)$$

where NA is the numerical aperture of the optical system and X is the wavelength of light.

In FIG. 1, an aerial pattern is transformed into a sharper resist profile (P2) compared to a linear resist (P1). P1, P1.5, P2 and P4 are 1, 1.5, 2 and 4 photon absorption profile, respectively. Combined with double patterning or multi-exposure, the two-photon resist is capable of producing sub-diffraction limit image and is a promising technique to extend optical lithography beyond its current limit. See e.g., Ch. J. Schwarz, A. V. V. Nampoothiri, J. C. Jasapara, W. Rudolph, and S. R. J. Brueck, J. Vac. Sci. & Tech. B 19 (6): 2362-2365 (2001). FIG. 2 demonstrates how a two-photon resist enables double patterning. With two exposures (P1A and P1B) shifted by a quarter of the spatial period will result in a uniform exposure (PF1) in a linear resist, as shown in FIG. 2a, a linear resist sums up the two exposures and results in a constant exposure, all contrast is lost. A two photon resist is a non-linear resist. A nonlinear resist has a nonlinear response rate to either exposure intensity or time, or both. In an ideal two-photon resist, the two exposures (P2A, P2B) will result in an exposure profile (PF2) with doubled spatial frequency, as shown in FIG. 2b. If the spatial frequency of the light pattern of each exposure is at the diffraction limit then this double patterning process enables sub-diffraction limit lithography.

In fact, similar to the above argument a multi-photon absorption process can be used to produce a multi-photon resist. In a multi-photon process, the absorption rate, R:

$$R = \delta I^P \quad (5)$$

where P equals to the number of photons involved in one absorption event. Multi-photon resist is capable of achieving even higher resolution, as shown in FIG. 2 for an example of P=4 (P4).

Further, in equation (5), the resolution will still be improved even if 1<P<2. As shown in FIG. 1. for P=1.5 (P1.5).

Current two-photon resists, however, are mainly used to create 3-D patterns, not in planary pattern creation. The main reason is the extremely high light intensity involved. The conventional two-photon absorption process is after all a second order process. It requires absolute coincidence of two photons on the absorbing molecule. The absorption cross-section is extremely small, ~$10^{-50}$ cm$^4$ S. See E. S. Wu, J. H. Strickler, W. R. Harrell, and W. Webb, Proc. SPIE 1674, 776 (1992). To achieve a practical intensity, a pico-second or femto-second laser has to be used. The DUV lasers used in current lithography industry has pulse width ~10 ns. We describe a new type of two-photon resist based on a mechanism other than the traditional two-photon absorption. The exposure in this resist may have a quadratic or higher order dependence on the light intensity yet it may not involve a traditional two-photon absorption, therefore we refer to it as $I^2$ resist. A two-photon resist, by our definition, is a special case of $I^2$ resist.

BRIEF DESCRIPTION OF THE DRAWINGS

These and other exemplary illustrative non-limiting features and advantages of exemplary illustrative non-limiting implementations will be better and more completely understood by referring to the following detailed description of presently preferred illustrative implementations in conjunction with the drawings, of which.

DETAILED DESCRIPTION OF EXEMPLARY NON-LIMITING ILLUSTRATIVE IMPLEMENTATIONS

A preferred non-limiting illustrative implementation provides a non-linear resist for lithography. An exemplary illustrative non-limiting resist implementation comprises for example a non-linear acid generator and polymeric resins.

A non-linear resist possessing high absorption cross-section may be integrated into existing optical lithography to create sub-diffraction limit patterns in production. Consider a series of exemplary non-limiting reactions:

(6a & 6b)

In this patent, "⇔" represents a reversible reaction, hv stands for a photon with frequency, v. A may be a photo sensitizer in the ground state. It may include an atom, a group of atoms, a molecule, a group of molecules, a nanocrystal or a group of nanocrystals. B may be the same photo sensitizer A at an excited state, i.e. different electronic configuration, spatial arrangement, ionic state, etc., or include a different molecule, nanocrystal, group of atoms, molecules or nanocrystals. C may be the same entity as B at an excited state, i.e. different electronic configuration, spatial arrangement, ionic state, etc., or include a different molecule, nanocrystal, group of atoms, molecules or nanocrystals. And D may include an atom, a molecule, a nanocrystal, a group of molecules, a group of nanocrystals, an ion, an electron, a proton, a photon at different wavelength, a chain scission event, a cross-linking event, or a series of reactions which may eventually result in the exposure of a resist.

I is the intensity of light, [A], [B] and [C] are the concentrations of A, B, and C respectively. Note that [A]+[B]+[C]=$C_0$, which is the initial concentration of A. $\sigma_1$ and $\sigma_2$ are the molar absorptivity of the reactant A and B at the actinic wavelength, $k_1$, $k_2$ are the reaction rates of the respective reverse reactions. And $k_3$ is the reaction rate of C→D.

The reactions described in equations 6a and 6b lead to a non-linear response of the resist to the light intensity. One exemplary illustrative non-limiting implementation comprises for example the reactions in equations (6a&b) are under steady state, which means the forward and reverse reactions are balanced. We can derive $$R = \frac{\sigma_1 \sigma_2 k_3}{k_1 k_2 + k_2 \sigma_1 I + \sigma_1 \sigma_2 I^2} C_0 I^2 \quad (7)$$

where R is the generation rate of reaction product D.

The generation rate of D apparently has a non-linear relationship to the light intensity I. Under certain circumstances, for example, if the reaction can be controlled such that, [B], [C]<<$C_0$, we can get:

$$R = \frac{\sigma_1 \sigma_2 k_3 C_0}{k_1 k_2} I^2 \quad (8)$$

Figure 1:
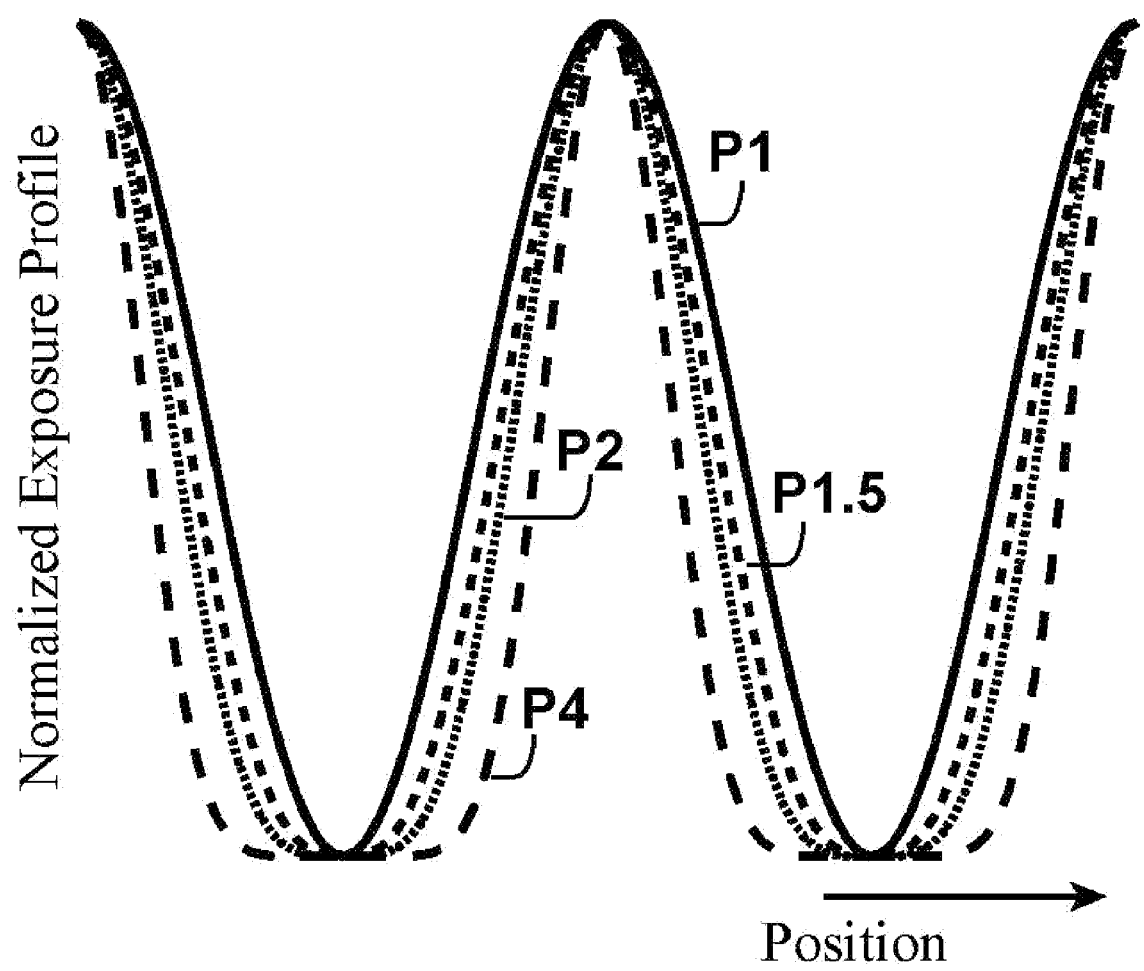
FIG. 1 is an exemplary illustrative prior art of a two photon absorption process.
Figure 2:
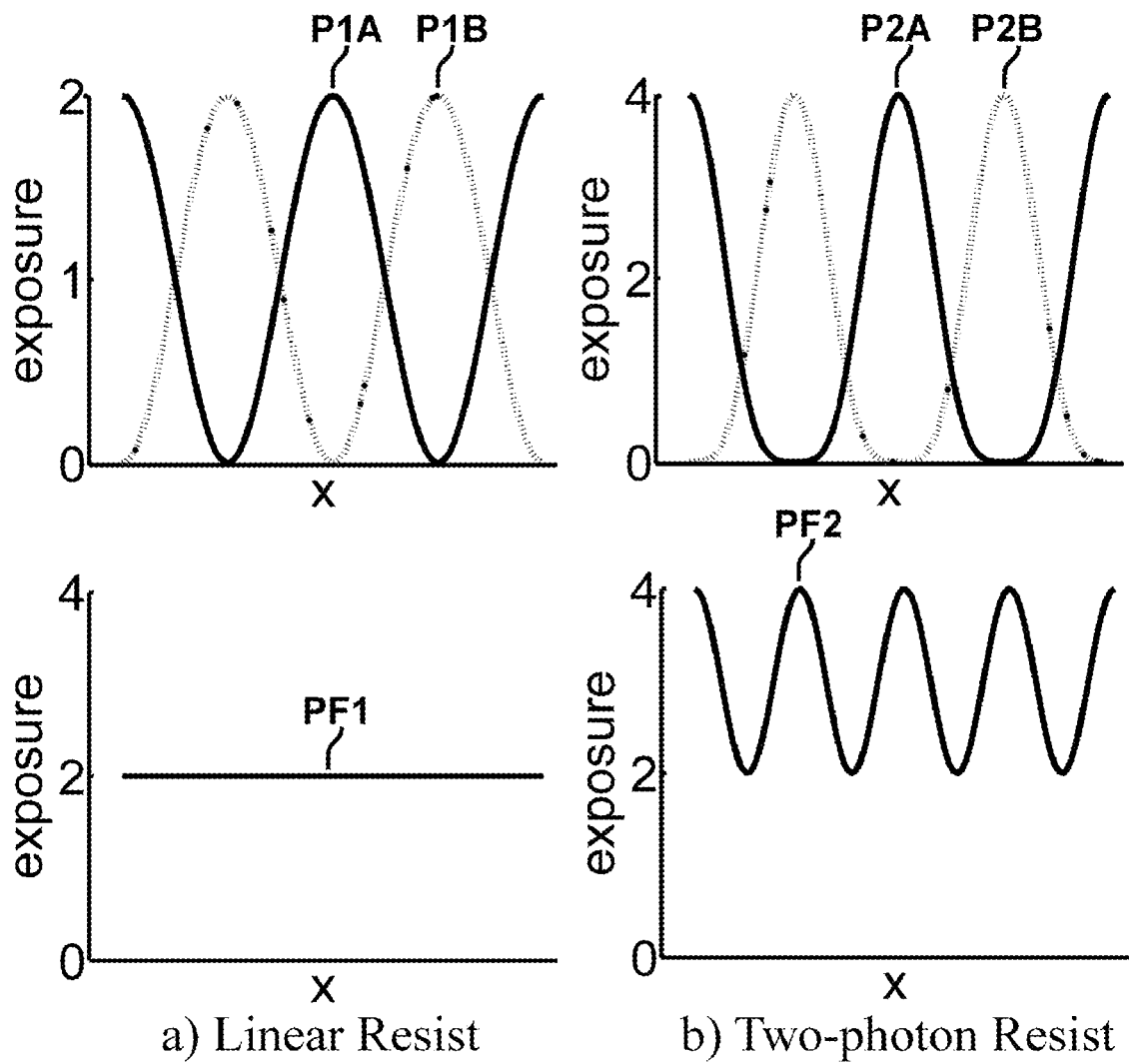
FIGS. 2a, 2b show an exemplary illustrative prior art of using double patterning combined with an $I^2$ resist to improve the lithography resolution.

And if the product D is proportional to the total exposure in the resist, equation (8) essentially provides an $I_2$ resist, which enables double patterning as shown in FIG. 2. The reaction described in equation (8), however, employs only the one-photon molar absorptivity therefore it may be realized with the intensity achievable in the current lithography infrastructure.

Other variations and combination of variations of the equations (6a&b) may also result in the same $I_2$ dependent relationship. A non-limiting example may be described as follows with four co-existing reactions:

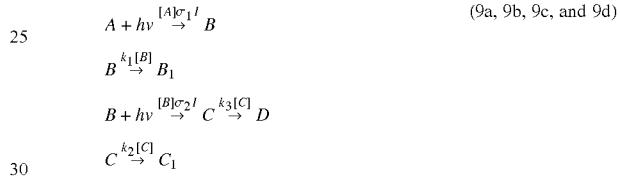

(9a, 9b, 9c, and 9d)

where $B_1$ and $C_1$ are the reaction by-products. They may be the same photo predecessor sensitizers at a different state, i.e. different electronic configuration, spatial arrangement, ionic state, etc., or include different atoms, molecules, nanocrystals, groups of atoms, molecules or nanocrystals, ions, protons, photons at different wavelength, chain-scission event or events, cross-linking event or events, or series of reactions.

Consider another series of exemplary non-limiting reactions:

(10a, 10b, and 10c)

$A_1$ and $A_2$ may be two different photo-sensitizers, again they can be atoms, group of atoms, molecules, groups of molecules, nanocrystals or groups of nanocrystals. B may be the same photo sensitizer $A_1$ at an excited state, i.e. different electronic configuration, spatial arrangement, etc., or a different molecule, nanocrystal, group of atoms, molecules or nanocrystals. C may be the same photo sensitizer $A_2$ at an excited state, i.e. different electronic configuration, spatial arrangement, etc., or a different atom, molecule, nanocrystal, group of atoms, molecules or nanocrystals. And D may include an atom, a molecule, a nanocrystal, a group of molecules, a nanocrystal, an electron, a proton, a photon at different wavelength, chain scission event or events, a cross-linking event or events, or a series of reactions which may eventually result in the exposure of a resist.

The reactions described in equations 10a, 10b and 10c lead to a non-linear response of the resist to the light intensity. One exemplary illustrative non-limiting implementation comprises for example the reactions in the equations (10a, 10b, and 10c) are under steady state. Assuming the last reaction is a first order reaction, then the generation rate of D may be shown as:

$$R = \frac{k_3[A_1][A_2]\sigma_1\sigma_2 I^2}{k_1 k_2} \tag{11}$$

The generation rate for D is an $I^2$ relationship and at the same time employs only the one-photon molar absorptivity, as shown in the equation (11), therefore it may be realized with the intensity achievable in the current optical lithography infrastructure.

An exemplary illustrative non-limiting resist implementation comprises for example semiconductor nanocrystals, acid generators and polymeric resins. Such non-limiting exemplary nanocrystals may have bandgaps that are smaller or equal to the lithographic wavelength. Nanocrystals are loosely defined as particles with diameter ranging from 1 nm to 100 nm which retain the stoichiometry and crystal structure of their bulk counterpart. They assume different names, such as quantum dot, quantum sphere, quantum crystallite, microcrystal, colloidal particle, nano-particle, nano-cluster, Q-particle or artificial atom. They also assume different shapes, such as spherical, cubical, rod-like, tetragonal, single or multiple-walled nano-tubes, etc.

Due to their small size, nanocrystals often demonstrate dramatically different physical properties from their bulk counterparts. Most prominent are the size-quantization and the tunability of the bandgap. For example in one of the model semiconductor nanocrystal material, CdSe, the optical absorption can be shifted from ~700 nm to ~400 nm by simply changing the size. See C. B. Murray, D. J. Norris, M. G. Bawendi, J. Am. Chem. Soc. 115, 8706(1993).

Figure 3:
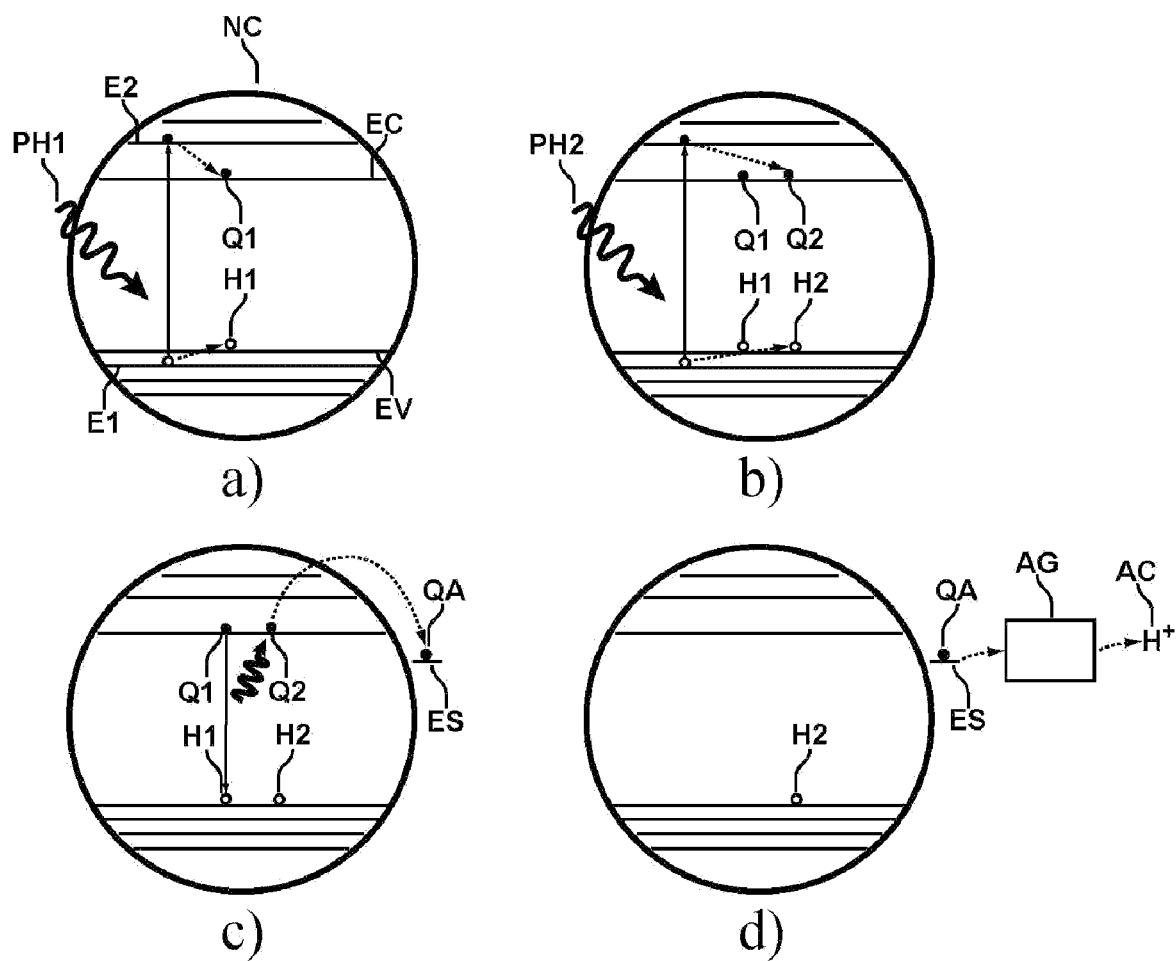
FIGS. 3a, 3b, 3c demonstrate an exemplary illustrative prior art of processes in a semiconductor nanocrystal.
FIG. 3d shows an exemplary illustrative implementation of utilizing the Auger electron to generate acid with acid generators.

As shown in FIG. 3a, one nanocrystal (NC) with quantized energy level is struck with a photon with an energy equal to or larger than the bandgap. This photon promotes an electron (Q1) from an energy level in the valence band (E1) to a level in the conduction band (E2), leaving a hole (H1) in E1. The electron and hole quickly thermalize to the lattice and relax their energy to their respective lowest energy levels (EC and EV) and form an exciton, allowing a second absorption of photon with the same energy. This process usually happens in less than 1 pico-second. See V. I. Klimov, D. W. McBranch, C. A. Leatherdale, and M. G. Bawendi, Phys. Rev B 60, 13740 (1999). If a second photon comes in before the first exciton recombines, as shown in FIG. 3b, then a second electron-hole pair (Q2 and H2) is created, which subsequently relaxes its energy and forms another exciton, as shown in FIG. 3b. Note that in FIG. 3b, although there are two electrons and holes at the same energy levels, it does not violate the Pauli exclusion principle. Said electron-hole pairs are in the form of excitons, which are bosons and do not obey the exclusion principle. In the particular examples in FIG. 3c, the energy released by the recombination of Q1 and H1 is transferred to Q2 through an Auger process. The electron Q2 gains enough energy to overcome the interface barrier between the nanocrystal and the surrounding medium to be ejected out of the nanocrystal and forms an Auger electron (QA), leaving a positive hole in the said nanocrystal, as shown in FIG. 3c. In said nonlinear resist, ES can be provided by a surface level, interface level, defect level in the surrounding medium, or a surfactant or an electron scavenger, a photo-acid generator or other functional chemicals in the resist.

The process described here may be described in light of equations (5). We only have to replace A with the semiconductor nanocrystal, replace B with the same nanocrystal and one exciton, replace C with the same nanocrystal and two excitons, and replace D with a charged nanocrystal and an ejected electron. As follows:

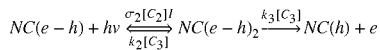

(12a & 12b)

where e represents an electron, h a hole, and (e-h) an exciton; [C1], [C2], [C3] are the concentration of nanocrystal with no exciton, one exciton and two excitons respectively; and again [C1]+[C2]+[C3]=$C_0$, the initial nanocrystal concentration.

As has been demonstrated by V. I. Klimov, A. A. Mikhailovsky, D. W. McBranch, C. A. Leatherdale, M. G. Bawendi, Science, 287, 1011(2000), the life time of two excitons in a nanocrystal is at least an order of magnitude shorter than one exciton. This means that we can assume $k_2 \gg k_1$, and $[C_2] \ll [C_1]$. Also, since the life time of the excitons (<ps) are usually much smaller than the duration of a pulsed used in optical lithography (~10 ns), the reaction may be considered at steady state. Hence the electron generation rate is quadratically dependent on the light intensity, as predicted by (8).

The equivalent two-photon absorption cross section was found to be $10^{-40}$ cm$^4$ s, much larger than that of the conventional two photon resist. See M. Haase, H. Weller, A. Henglein, J. Phys. Chem, 92, 4706(1988). This large absorption cross section allows this resist to be exposed at a much lower light intensity, namely, a level achievable by the laser used in the lithography industry.

An aspect of preferred non-limiting illustrative implementation provides a nanocrystal based non-linear resist for lithography. As shown in FIG. 3d, the Auger electron QA, can be further transferred to an acid generator (AG), either attached to the surface or in the close proximity of the nanocrystal NC, the acid generator AG accepts the Auger electron QA and releases an acid (AC) (most conventional photo-acid generators used in lithography have been shown to be able to react with low energy electrons to release acids. See Atsuro Nakano, Takahiro Kozawa, Seiichi Tagawa, Tomasz Szreder, James F. Wishart, Toshiyuki Kai, and Tsutomu Shimokawa, Jpn. J. Appl. Phys., 45, L197-L200 (2006).), said acid AC subsequently reacts with polymeric resin in said non-linear resist to change the solubility of said polymeric resin in an appropriate development solvent in the areas exposed. The hole left behind, H2, may eventually be trapped in a defect level, surface level, interface level, a hole scavenger, or any functional chemicals in the resist.

Another aspect of the preferred non-limiting illustrative implementation of providing a nanocrystal based resist is that the Auger process can eject a hole instead of an electron, in this case the acid generator AG donates an electron to the ES level or the said nanocrystal directly, recombine with the hole generated by the Auger process and release an acid, this acid reacts with polymeric resin in said non-linear resist to change the solubility of said polymeric resin in an appropriate development solvent in the areas exposed.

Another aspect of the preferred non-limiting illustrative implementation of providing a nanocrystal based resist is that the non-linearity is a result of two-photon absorption, as described in equation (1), between two energy levels inside said nanocrystal. The excited electron, or hole, may gain enough energy to overcome the barrier between the nanocrystals and is excited out of the nanocrystal into energy level ES in FIG. 3c. ES can be provided by a surface level, interface level, defect level in the surrounding medium, or a surfactant or an electron scavenger, a photo-acid generator or other functional chemicals in the resist.

Another aspect of the non-limiting illustrative exemplary implementation of providing a nanocrystal based resist is that the Auger process can eject a hole instead of an electron, in this case the acid generator AG in FIG. 3d donates an electron to the energy level ES of the said nanocrystal directly, recombine with the hole generated by the Auger process and release an acid, this acid reacts with polymeric resin in said nonlinear resist to change the solubility of said polymeric resin in an appropriate development solvent in the areas exposed.

Another aspect of the preferred non-limiting illustrative implementation of providing a non-linear resist is to use 193 nm resist polymers such as co-, ter-, tetra-polymers of; methacrylates comprising terpolymer tetr-butyl methacrylate, methyl methacrylate, methacrylic acid; norbornenes comprising copolymer norbornene-maleic anhydride, copolymer norbornene-sulfur dioxide; copolymer vinyl ether-maleic anhydride; and their derivatives Another aspect of the preferred non-limiting illustrative implementation of providing a non-linear resist is to use 248 nm resist polymers such as co-, ter-, tetra-polymers of; tert-butoxycarbonyls comprising poly 4-tert-butoxycarbonyloxy-styrene, poly(styrene-co-(4-hydroxyphenyl)maleimide), poly(styrene-co-maleimide), poly(4-hydroxystyrene sulfone), poly(4-hydroxy-a-methylstyrene), poly(tert-butoxystyrene-co-4-acetoxystyrene), poly[4-(2-hydroxyhexafluoroisopropyl)styrene]; copolymers of tert-butoxystyrene and tert-butyl acrylates; and their derivatives and molecular glasses, such as 4-[4-[1,1-Bis(4-tert-butoxycarbonyloxybenzyl)-ethyl]]-r,r-dimethyl benzylphenol.

Another aspect of the preferred non-limiting illustrative implementation of providing a non-linear resist is to use 157 nm resist polymers such as co-, ter-, tetra-polymers comprising tetrafluoroethylene-norbornene; 2-trifluoromethylacrylate-norbornene; 2-trifluoromethylacrylate-styrene, 2-trifluoromethylacrylate-vinyl ether; methacrylates; and their derivatives.

Another aspect of the preferred non-limiting illustrative implementation of providing a non-linear resist is to use 365 nm resists such as diazonaphthoquinone/novolac resist.

Another aspect of the preferred non-limiting illustrative implementation of providing a non-linear resist is to use acid quenchers such as aniline derivatives or 1,8 diazabicyclo [5.4.0]undec-7-ene.

Another aspect of the preferred non-limiting illustrative implementation of providing a non-linear resist is to use this resist with a photoacid generator from a non-exhaustive list of diaryliodonium salts such as bis(4-tert-butylphenyl)iodonium trifluoromethane sulfonate; triarylsulfonium salts such as triphenylsulfonium hexafluoroantimonate; and nanionic photoacid generators such as 1,2,3,-tris(methanesulfonyloxy)benzene.

Another preferred non-limiting illustrative implementation is also to provide a non-linear resist for lithography. An exemplary illustrative non-limiting resist implementation comprises for example semiconductor nanocrystals and polymeric resins. Said nanocrystals have bandgaps smaller or equal to the lithographic wavelength. In such a resist, said semiconductor nanocrystals generate Auger carriers (either electrons or holes) upon absorbing the photons, said carriers may cause scissions in the surrounding polymers and change the solubility of said polymers in developer under the exposed area.

Another preferred non-limiting illustrative implementation is also to provide a non-linear resist for lithography. Said resist comprises, but not exclusively, of semiconductor nanocrystals and polymeric resins. Said nanocrystals have bandgap smaller or equal to the lithographic wavelength. In such a photo-resist, said semiconductor nanocrystals generate Auger carriers (either electrons or holes) upon absorbing the photons, said carriers may cause cross-linking in the surrounding polymers and change the solubility of said polymers in developer under the exposed area.

One aspect of the above preferred non-limiting illustrative implementations of providing a nanocrystal based resist is that said resists may provide high refractive index. The semiconductor nanocrystals usually have much higher refractive indices at DUV range than polymers. With significant loading of nanocrystals in the nonlinear resist, it can be used as a high refractive index resist, which renders extra resolution benefits when used with immersion lithography.

Another preferred non-limiting illustrative implementation provides a resist for EUV lithography. Said resist includes semiconductor nanocrystals. EUV lithography uses light with a wavelength of 13.4 nm, in the soft X-ray range. The photon energy is higher than the bandgap of any material. In such a resist, a photon excites electrons from the core levels of the constituent atoms of the nanocrystals. The excited electron may create multiple excitons through impact ionization. The recombination energy released by these multiple electron-hole pairs can be transferred to one or multiple electrons (or holes) through the Auger process. These Auger electrons (or holes) possess energies to overcome the energy barrier between the nanocrystal and surrounding medium. Said Auger electrons (or holes) may escape the nanocrystals and change the solubility of the polymer under the exposed area.

Another preferred non-limiting illustrative implementation provides an N-photon resist, $N \geq 2$. Said N-photon resist includes at least one N-step reaction causing nonlinear response proportional to $I^N$. Resolution equal to one Nth of the diffraction limit can be achieved.

Another preferred non-limiting illustrative implementation provides an N-photon resist, $N \geq 2$. Said N-photon resist includes semiconductor nanocrystals. In a similar fashion as a two-photon Auger process described in FIG. 3, N-photon process can also occur in nanocrystals, generating an Auger electron or hole. Resolution equal to one Nth of the diffraction limit can be achieved.

Another preferred non-limiting illustrative implementation provides a nonlinear resist for quantum interferometric lithography process employing entangled photons. Said nonlinear resist includes semiconductor nanocrystals. The entangled photons may be generated by a parametric down conversion process. The quantum entanglement enables all said entangled photons to be absorbed simultaneously at the presence of an N-photon resist. The advantage of the said process is that it achieves $\lambda/2N$ resolution without high intensity usually required for a nonlinear resist.

One aspect of all the above preferred non-limiting illustrative implementations is that they may provide high etch resistance. The semiconductor nanocrystals usually have much higher etch-resistance than polymers. With significant loading of nanocrystals in the nonlinear resist, it can be used as a high etch resistance resist, which renders extra resolution benefits over polymer based resist.

Another preferred non-limiting illustrative implementation provides a process of producing devices and structures on a substrate using an $I^2$ resist. Said $I^2$ resist may comprise nanocrystals and polymeric resins. Said nanocrystals have bandgap smaller than or equal to the lithographic wavelength.

Another preferred non-limiting illustrative implementation provides a process of producing devices and structures on a substrate using an $I^2$ resist in a double patterning process. Said $I^2$ resist may comprise nanocrystals and polymeric resins. Said nanocrystals have bandgap smaller than or equal to the lithographic wavelength. The two exposures may be separated by periods long enough for the said nanocrystals to reset. The two exposures may have at least some different pre-determined exposure parameters to ensure the best resolution of the final resist exposure profile.

Another aspect of the preferred non-limiting illustrative implementation of a process of producing devices and structures on a substrate is that the pattern on said substrate may have a resolution that is higher than the diffraction limit of the wavelength of said illuminating light.

Another aspect of the preferred non-limiting illustrative implementation of a process of producing devices and structures on a substrate is that the nanocrystals may generate electrons or holes upon absorbing photons within said illuminating light. The wavelength may comprise at least one of 365 nm, 257 nm, 248 nm, 198 nm, 193 nm, 157 nm, and 121 nm.

Another aspect of the preferred non-limiting illustrative implementation of a process of producing devices and structures on a substrate is that the said nanocrystals may be chosen from the non-exclusive list of materials: C, Si, Ge, MgO, $MgF_2$, ZnO, ZnS, ZnSe, CdS, CdSe, CdTe, HgTe, PbS, BN, AlN, AlBGaN, AlP, AlAs, BP, BAs, GaN, $Ga_2O_3$, GaP, GaAs, $In_2O_3$, InP, InAs, SiC, $Si_3N_4$, $CaF_2$, $Al_2O_3$, $SiO_2$, $TiO_2$, $Cu_2O$, $ZrO_2$, $SnO_2$, $Fe_2O_3$, $HfO_2$, $Gd_2O_3$, $CeO_2$, $Y_2O_3$, Au, Ag, Al, Cu, and their various polymorphs and alloys; said nanocrystals may be in spherical, cubic, rod-like, tetragonal, single or multi-wall nano-tube or other nano-scale geometric shapes; and particles may be doped by other elements; said nanocrystals may be coated with one or more shells of other materials; and said shell material may comprise any known materials.

Another aspect of the preferred non-limiting illustrative implementation of a process of producing devices and structures on a substrate is that the resist may comprise acid generators and polymeric resin. Each acid generator may create at least one acid upon accepting at least one electron (or hole). The acid may further change the solubility of said polymeric resin in a developer. The resist may comprise polymeric resin that can change solubility in a developer upon accepting at least one electron (or hole).

Another aspect of the preferred non-limiting illustrative implementation of a process of producing devices and structures on a substrate is that the nanocrystals may be non-uniformly distributed depthwise within said resist.

Another aspect of the preferred non-limiting illustrative implementation of a process of producing devices and structures on a substrate is that the nanocrystals may provide high etch resistance and/or a high refractive index.

The exemplary illustrative non-limiting technology herein may further provide a manufacturing line for creating a pattern on a substrate, comprising a device that applies a resist comprising nanocrystals to said substrate; a source of illumination that illuminates said resist with a pattern of light at a predetermined wavelength, said nanocrystals absorbing said light to at least in part expose said resist; and at least one further device that processes said exposed resist to create said pattern on said substrate. The processing line same or different illuminator may illuminate said resist plural times to multiply expose said resist.

The exemplary illustrative non-limiting technology herein may further provide device having a pattern thereon created at least in part by illuminating a resist disposed on a substrate, said resist comprising nanocrystals that absorb at least a portion of said illumination to at least in part expose said resist.

The illustrative non-limiting exemplary technology herein may also provide product intermediary comprising: a substrate having at least one surface; and a resist layer that at least in part covers said at least one substrate surface, said resist layer comprising nanocrystals that, when exposed by illuminating light, absorb at least a portion of said illuminating light to change the solubility of said resist layer.

The exemplary illustrative non-limiting technology herein may further provide an integrated circuit comprising a substrate; and at least one structure disposed on said substrate, wherein said structure is formed at least in part using a nonlinear resist comprising nanocrystals that absorb illumination to change the resist's solubility. The structure may comprise an electrical circuit component such as a transistor.

The exemplary illustrative non-limiting technology herein further provides an optical device comprising a substrate; and at least one structure disposed on said substrate, wherein said structure is formed at least in part using a nonlinear resist comprising nanocrystals that absorb illumination to change the resist's solubility. The structure may be three-dimensional.

Another common aspect of the all the previously disclosed preferred non-limiting illustrative implementations is that they are intended to be compatible and be used in dry, water immersion, or high refractive index immersion lithography.

EXAMPLES

Figure 4:
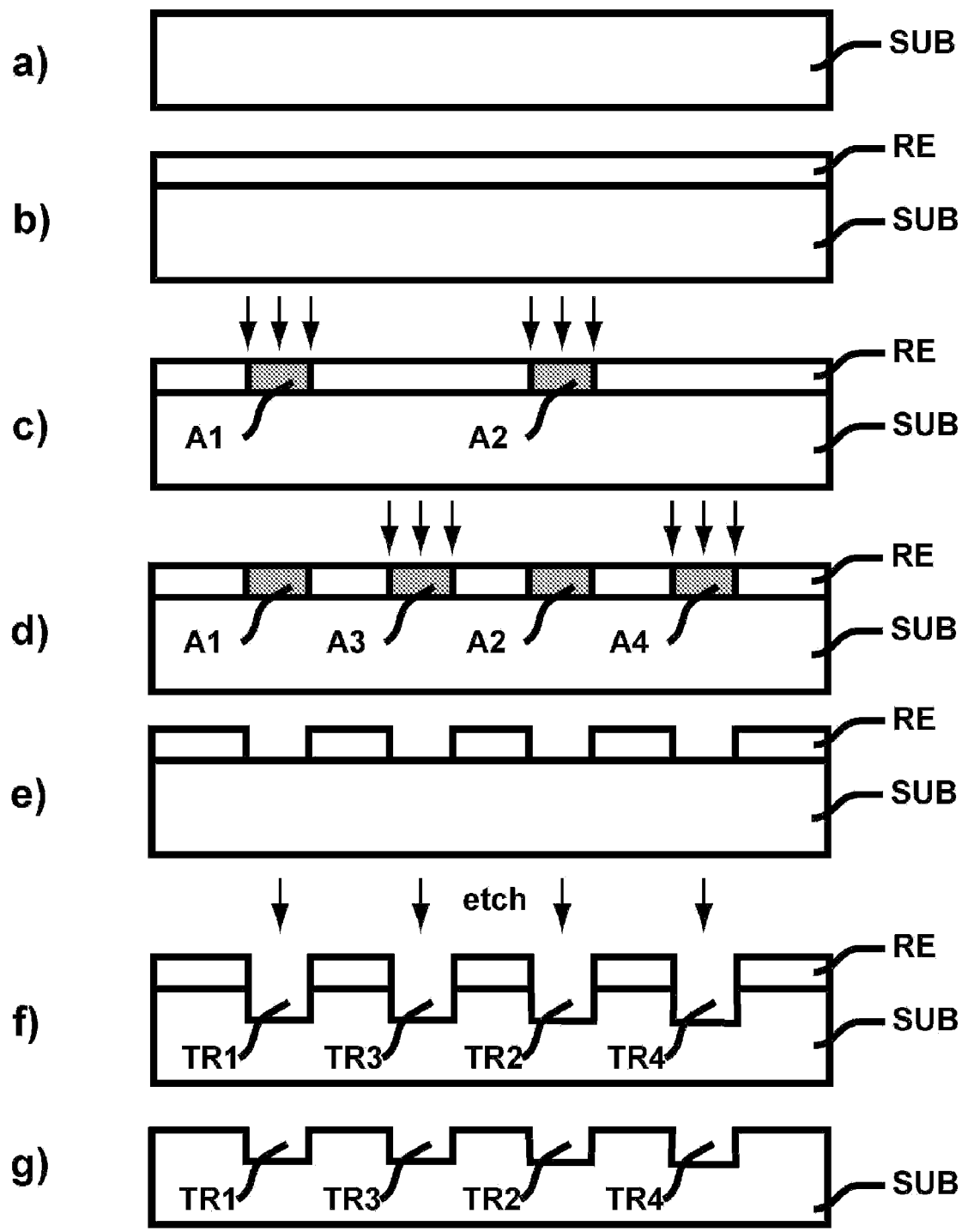
FIGS. 4a-4g show an exemplary illustrative implementation of a double patterning process, using a nonlinear resist.

A non-limiting illustrative example of a double patterning process using $I^2$ resist to create trenches is shown in FIG. 4. In FIG. 4a, a substrate (SUB) is cleaned and treated accordingly. In FIG. 4b, a layer of said $I^2$ resist (RE) is applied on top of the said substrate and a pre-bake is carried out to remove the solvent in the $I^2$ resist. FIG. 4c, an exposure using a lithographic process is then provided to expose the first group of desired areas (A1, A2) of said nonlinear resist. FIG. 4d, a second exposure is provided to expose the second group of desired areas (A3, A4) of said $I^2$ resist. In FIG. 4e, the $I^2$ resist is developed and the exposed area removed and a post bake is carried out. In FIG. 4f, an etch process is then carried out to create trenches (TR1, TR2, TR3, TR4) at the exposed area. And finally in FIG. 4g, the rest of the resist is stripped off.

Figure 5:
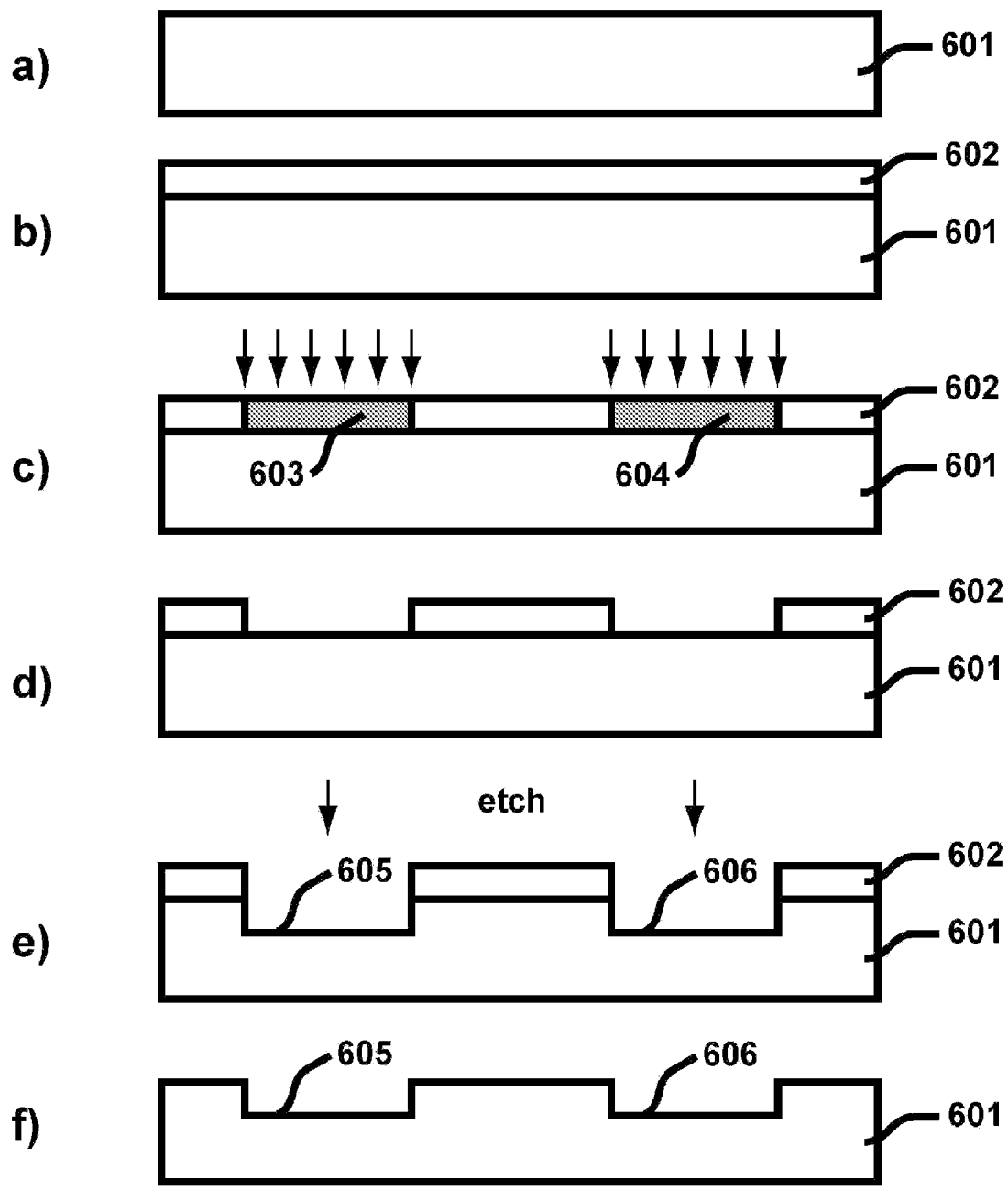
FIGS. 5a-5f show an exemplary illustrative implementation of a patterning process, using an I² resist.

A non-limiting illustrative example of a process to create two trenches is shown in FIG. 5. In FIG. 5a, a substrate (601) is cleaned and treated accordingly. In FIG. 5b, a layer of said nonlinear resist (602) is applied on top of the substrate (601) and a pre-bake is carried out to remove the solvent in the nonlinear resist. In FIG. 5c, an exposure using a lithographic process is then provided to expose the desired areas (603, 604) of said nonlinear resist. In FIG. 5d, the nonlinear resist is developed and the exposed area removed and a post bake is carried out. In FIG. 5e, an etch process is then carried out that create trenches (605, 606) at the exposed area. And finally in FIG. 5f, the rest of the resist is stripped off. By repeating this process multiple times, and replacing the etching process with other processes such as ion implantation, film deposition, oxidation, etc, an electronic device or other 3-D structures can be fabricated.

Figure 6:
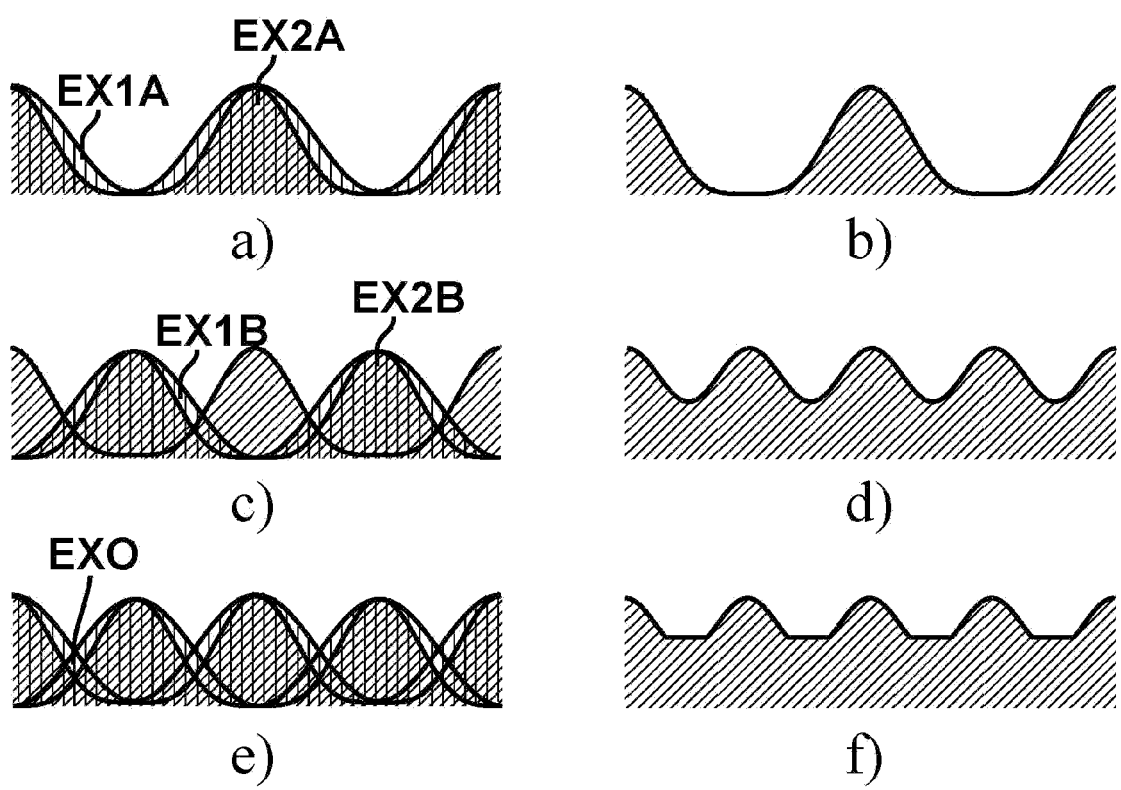
FIGS. 6a-6f show an illustrative non-limiting example of how the reset time of the nanocrystal based I² resist in a double patterning process affects the resolution.

Another non-limiting illustrative example provides a method of creating sub-diffraction patterns using double patterning with the disclosed I² resist, as shown in the normalized exposure profile in FIG. 6. First, a layer comprising said resist is spin-coated on a silicon wafer. The said nonlinear resist is then exposed to a diffraction limited fringe pattern. The shaded area (EX2A) received high enough intensity to undergo two-photo process. In the area EX1A, only one-photon absorption occurred. After the first illumination, all the photon-generated electrons and holes in EX1A will recombine (reset). After EX1A is fully reset, as shown in FIG. 6b, a second exposure with identical fringe pattern, shifted half a period relative to the first pattern, is applied, as shown in FIG. 6c. The same situation repeats, area EX2B undergoes two-photon process while EX1B only experience one-photon absorption. The final resist exposure profile of half the diffraction limit is thus created, as shown in FIG. 6d.

Note that if the second exposure occurred before EX1A fully reset, part of or all of EX1A will also be exposed, reducing the final resolution. FIG. 6e demonstrates the worst case scenario where the second exposure occurs before EX1A undergoes any reset at all, the area EXO, which is the overlapped area between EX1A and EX1B, will also go through two-photon process. The final exposure profile shown in FIG. 6f has a flat bottom, which reduces the contrast and changes the ratio between lines and spaces. For an ideal two-photon resist the profile in FIG. 6f may still provide sub-diffraction limit resolution.

Another non-limiting illustrative example provides for having a linear photo base generator in addition to the I² acid generator. The presence of base in the resist serves to neutralize the acid and can be used to improve the performance of the resist. The resultant acid concentration will be proportional to $I^2 - \alpha I$ where $\alpha$ represents the relative sensitivity of the photo base generator.

Another non-limiting illustrative example of creating patterns using the disclosed resist is to vary exposure focal point and/or intensity of each exposure in a multi-exposure process to create a uniform exposure profile throughout the entire thickness of the said nonlinear resist.

Figure 7:
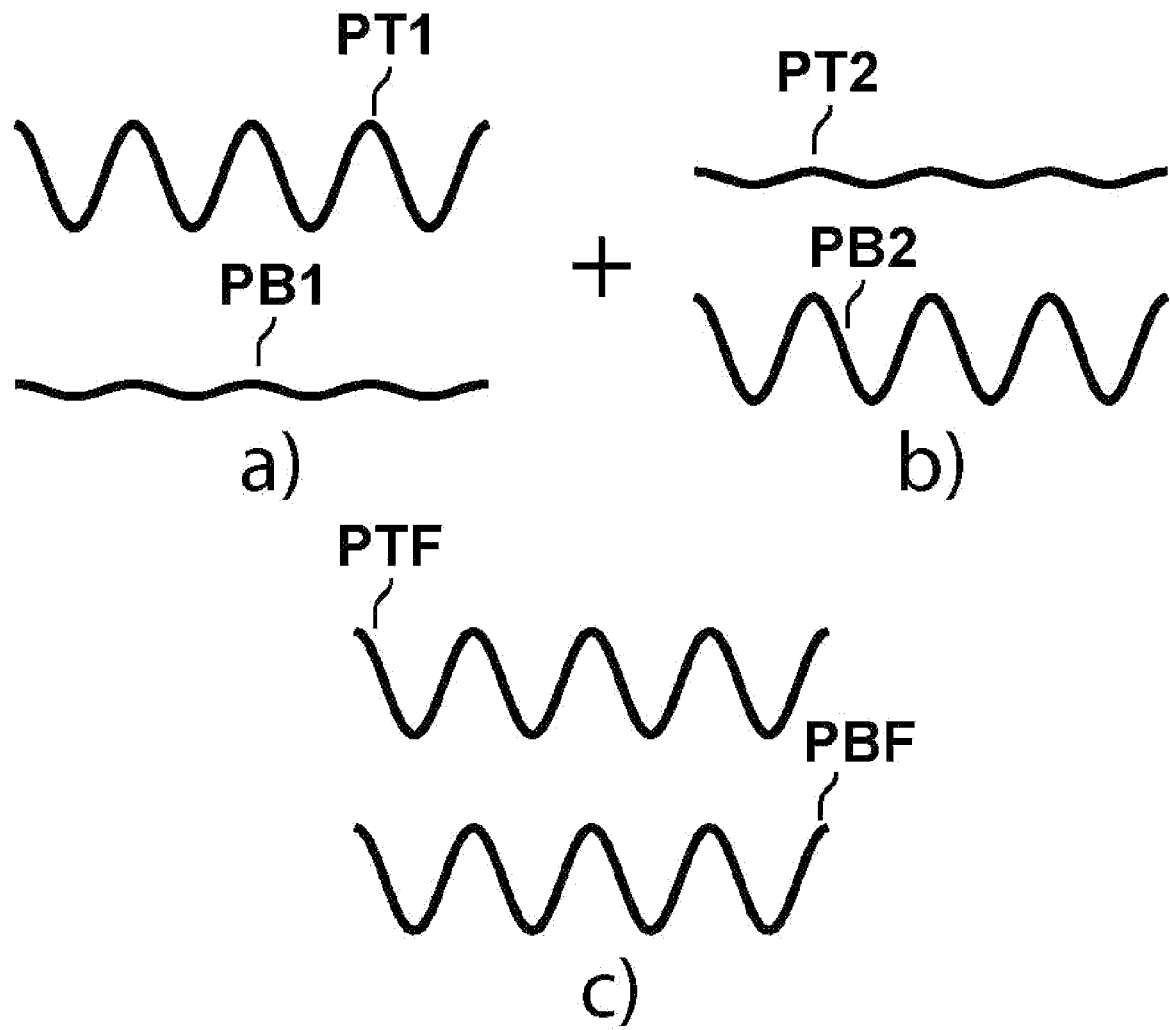
FIGS. 7a, 7b and 7c show an illustrative non-limiting example of achieving uniform exposure across the entire thickness using the I² resist in a multiple exposure and double patterning process.

Since the energy of the photon used in the lithography is larger than the bandgap of the nanocrystals, the said nonlinear resist may have relatively large absorbance. The top of the resist layer will have higher exposure dosage than the one received by the bottom of the resist. As shown in FIG. 7, this problem can be overcome by forming an image with at least two exposures. In the first exposure, the focal plane of the projection system is adjusted so that a diffraction limited image (PT1) is focused on the surface of the resist, the light pattern at the bottom of the resist (PB1) is blurred and attenuated as shown in FIG. 7a. The intensity of the exposure will be adjusted so that the light intensity at the bottom of the resist is low enough so the exposure of the resist is negligible.

In the second exposure, the focal plane of the projection system is adjusted so that a diffraction limited image (PB2) is focused on the bottom of the resist and the light pattern at the surface is blurred (PT2) as shown in FIG. 7b. The intensity of the exposure will be adjusted so that the light intensity at the surface of the resist is low enough so that the exposure of the resist is negligible. Or the exposure is almost uniform so it does not reduce the spatial frequency of the existing exposure. The final exposure, as shown in FIG. 7c, will have same exposure profile at both the top (PTF) and the bottom of the resist (PTB).

Multiples exposures can also be performed to achieve uniform exposure by adjusting the pre-calculated focal plane and intensity of each exposure to predetermined values.

Another non-limiting illustrative example of providing a resist layer comprising nanocrystals is that the resist layer possesses a concentration gradient profile depth-wise. Said concentration profile may provide higher sensitivity towards the bottom of the resist layer since the light intensity at the bottom of the resist is lower; and lower sensitivity towards the top of resist since the top of the resist receives more light intensity.

While the technology herein has been described in connection with what is presently considered to be the most practical and preferred implementation, it is to be understood that the invention is not to be limited to the disclosed implementations, but on the contrary, is intended to cover various modifications and equivalent arrangements included within the scope of the appended claims.

We claim:

1. A resist comprising:
   at least one first photoactive material, said first photoactive material, in use, undergoing at least one plural-step reaction comprising, absorption of at least one photon to generate at least one second photoactive material, said second photoactive material at least in part reversing to the first photoactive material unless said second photoactive material absorbs at least another photon to ultimately lead to a change in solubility of said resist, wherein said first photoactive material, said second photoactive material or both comprises at least one organic molecule, and at least said first photoactive material comprises nanocrystals, and the resist further comprises a matrix comprising a molecular glass.

2. The resist of claim 1 wherein said absorption of at least another photon by said second photoactive material produces at least one chemical species that leads to said change in solubility.

3. The resist of claim 2 wherein said chemical species production is non-linearly dependent on the intensity of light projected onto said resist.

4. The resist of claim 2 wherein said chemical species leads to changes in said solubility in the presence of a developer.

5. The resist of claim 1 wherein said nanocrystals are semiconductor nanocrystals.

6. The resist of claim 1 wherein at least one of said first and second photoactive material further comprises a semiconductor.

7. The resist of claim 1 wherein at least one of said first and second photoactive material further comprises at least one inorganic molecule.

8. The resist of claim 1 further including an acid generator.

9. The resist of claim 8 wherein said acid generator forms an acid in a manner that is non-linearly dependent on the intensity of light.

10. The resist of claim 9 wherein the change in solubility is at least in part caused by acid catalyzed deprotection.

11. The resist of claim 1 wherein the change in solubility is at least in part caused by chain scission.

12. The resist of claim 1 wherein the change in solubility is at least in part caused by cross linking.

13. The resist of claim 1 wherein said resist comprises at least one additive to improve resolution and line edge roughness.

14. The resist of claim 13 wherein said additive comprises at least one base to quench at least one photo-generated acid.

15. The resist of claim 13 wherein said additive comprise at least one base generator.

16. The resist of claim 1 further including a base generator.

17. The resist of claim 16 further including an acid generator.

18. The resist of claim 1 wherein said first photoactive material absorbs at least one photon having a wavelength comprising at least one of 365 nm, 257 nm, 248 nm, 198 nm, 193 nm, and 121 nm to generate the at least one second photoactive material.

19. The resist of claim 18 wherein said second photoactive materials reverses back to the first photoactive material unless said second photoactive material absorbs at least another photon having a wavelength comprising at least one of 365 nm, 257 nm, 248 nm, 198 nm, 193 nm, and 121 nm to lead to a change in solubility of said resist.

20. The resist of claim 1 wherein said resist provides etch resistance enhanced at least in part by said nanocrystals.

21. The resist of claim 1 wherein said resist provides an index of refraction enhanced at least in part by said nanocrystals.

22. The resist of claim 1 wherein said resist is structured for use in immersion lithography.

23. A method of exposing a resist comprising at least one first photoactive material comprising:
    illuminating at least part of said resist with photons having at least one wavelength, said resist including an acid generator,
    said illuminating inducing, in said resist in a manner that is non-linearly dependent on the intensity of said illuminating, at least one chemical species production based on at least one plural-step reaction;
    said first photoactive material absorbing at least one photon to generate at least one second photoactive material, and
    said second photoactive material reversing to the first photoactive material unless said second photoactive material absorbs at least another photon to lead to production of said chemical species,
    said chemical species leading to a change in solubility of said resist,
    said at least first photoactive material comprising nanocrystals,
    wherein the resist comprises a matrix comprising a molecular glass.

24. The method of claim 23 wherein said illuminating comprises forming at least a first pattern by passing said photons through at least one photomask.

25. The method of claim 24 wherein said illuminating comprises forming at least a second pattern at a time after forming said first pattern.

26. The method of claim 25 wherein said second pattern is formed by passing said light through at least a second photomask.

27. The method of claim 26 wherein illuminating said second pattern is performed after said reversing.

28. The method of claim 23 wherein said nanocrystals are semiconductor nanocrystals.

29. The method of claim 23 wherein at least one of said first and second photoactive material comprises a semiconductor.

30. The method of claim 23 wherein at least one of said first and second photoactive material comprises at least one organic molecule.

31. The method of claim 23 wherein at least one of said first and second photoactive material comprises at least one inorganic molecule.

32. The method of claim 23 wherein the change in solubility of said resist is at least in part caused by chain scission.

33. The method of claim 23 wherein the change in solubility of said resist is at least in part caused by cross linking.

34. The method of claim 23 wherein the change in solubility of said resist is at least in part caused by acid catalyzed deprotection.

35. The method of claim 23 wherein said resist comprises at least one additive to improve resolution and line edge roughness.

36. The method of claim 35 wherein said additive comprises at least one base to quench at least one photo-generated acid.

37. The method of claim 23 wherein said chemical species leads to changes in said solubility in the presence of a developer.

38. The method of claim 35 wherein said additive comprise at least one base generator.

39. The method of claim 23 wherein said resist further includes a base generator.

40. The method of claim 23 wherein said resist provides etch resistance enhanced at least in part by said nanocrystals.

41. The method of claim 23 wherein said resist provides an index of refraction enhanced at least in part by said nanocrystals.

42. The method of claim 23 including using immersion lithography.

43. The method of claim 23 wherein said illuminating comprises illuminating with photons of at least one of the following wavelengths: 157 nm, 193 nm, 248 nm, 257 nm, 198 nm, 121 nm and 365 nm.

44. The method of claim 23 wherein said illuminating comprises illuminating with EUV photons.

45. The method of claim 23 further including developing said resist.

46. The method of claim 23 wherein said illuminating comprises illuminating said resist for a first time period, waiting, and then further illuminating said resist for a second time period.

47. The method of claim 46 wherein said illuminating and further illuminating use the same pattern.

48. The method of claim 46, wherein said illuminating and further illuminating use different patterns.

49. The method of claim 46 wherein said illuminating includes passing said photons through an optical system having a resolution limited by diffraction, and
    said change in solubility of said resist, results in a sub-diffraction limited pattern.

50. The method of claim 23 wherein said illuminating includes passing said photons through an optical system having a resolution limited by diffraction, and
    said change in solubility of said resist, results in a sub-diffraction limited pattern.

51. The method of claim 23 wherein said illuminating comprises illuminating said resist multiple times separated by waiting times there between.

52. The method of claim 51, wherein all of said multiple illuminations use the same pattern.

53. The method of claim 51, wherein some of said multiple illuminations use different patterns.

54. The method of claim 51 wherein said illuminating includes passing said photons through an optical system having a resolution limited by diffraction, and
    said change in solubility of said resist, results in a sub-diffraction limited pattern.

55. A resist comprising:
    at least one first photoactive material, said first photoactive material, in use, undergoing at least one plural-step reaction comprising, absorption of at least one photon to generate at least one first intermediate material, said first intermediate material reversing back to the first photoactive material unless at least another photon is absorbed by a photoactive material to generate at least one second intermediate material, said second intermediate material alone or in combination with said first intermediate material leading to a change in solubility of said resist, wherein at least one of said first photoactive material, first intermediate material, and second intermediate material comprises at least one organic molecule and wherein at least said first photoactive material comprises nanocrystals, the resist further comprising a matrix comprising molecular glass.

56. The resist of claim 55 wherein said second intermediate material alone or in combination with said first intermediate material leading to production of at least one chemical species, said at least one chemical species leads to a change in solubility of said resist.

57. The resist of claim 56 wherein said chemical species production is non-linearly dependent on the intensity of light projected onto said resist.

58. The resist of claim 56 wherein said chemical species leads to changes in said solubility in the presence of a developer.

59. The resist of claim 55 wherein said nanocrystals are semiconductor nanocrystals.

60. The resist of claim 55 wherein at least one of said first photoactive material, first intermediate material, and second intermediate material further comprises a semiconductor.

61. The resist of claim 55 wherein at least one of said first photoactive material, first intermediate material, and second intermediate material further comprises at least one inorganic molecule.

62. The resist of claim 55 further including an acid generator.

63. The resist of claim 62 wherein said acid generator forms an acid in a manner that is non-linearly dependent on the intensity of light.

64. The resist of claim 63 wherein the change in solubility is at least in part caused by acid catalyzed deprotection.

65. The resist of claim 55 wherein the change in solubility is at least in part caused by chain scission.

66. The resist of claim 55 wherein the change in solubility is at least in part caused by cross linking.

67. The resist of claim 55 wherein said resist comprises at least one additive to improve resolution and line edge roughness.

68. The resist of claim 67 wherein said additive comprises at least one base to quench at least one photo-generated acid.

69. The resist of claim 67 wherein said additive comprise at least one base generator.

70. The resist of claim 55 further including a base generator.

71. The resist of claim 70 further including an acid generator.

72. The resist of claim 55 wherein said first photoactive material absorbs at least one photon having a wavelength comprising at least one of 365 nm, 257 nm, 248 nm, 198 nm, 193 nm, and 121 nm to generate the at least one first intermediate material.

73. The resist of claim 72 wherein said first intermediate material reverses back to the first photoactive material unless at least another photon is absorbed by a photoactive material to generate at least one second intermediate material, said at least another photon having a wavelength comprising at least one of 365 nm, 257 nm, 248 nm, 198 nm, 193 nm, and 121 nm to lead to a change in solubility of said resist.

74. The resist of claim 55 said resist provides etch resistance enhanced at least in part by said nanocrystals.

75. The resist of claim 55 wherein said resist provides an index of refraction enhanced at least in part by said nanocrystals.

76. The resist of claim 55 wherein said resist is structured for use in immersion lithography.

77. A method of exposing a resist comprising at least one first photoactive material comprising:

illuminating at least part of said resist with photons from at least one photon source, said resist including an acid generator;

said (at least two) photons passing through an optical system, said photons having at least one wavelength, inducing, in said resist in a manner that is non-linearly dependent on the intensity of said illumination, at least one chemical species production based on at least one plural-step reaction;

said at least one plural-step reaction comprising, absorption of at least one photon by said first photoactive material to generate at least one first intermediate material, said first intermediate material reversing back to the first photoactive material unless at least another photon is absorbed by a photoactive material to generate at least one second intermediate material, said second intermediate material alone or in combination with said first intermediate material leading to production of said chemical species, said chemical species leads to a change in solubility of said resist, wherein at least said first photoactive material comprises nanocrystals, the resist further comprising a matrix comprising molecular glass.

78. The method of claim 77 wherein said illuminating comprises forming at least a first pattern by passing said photons through at least one photomask.

79. The method of claim 78 wherein said illuminating comprises forming at least a second pattern after forming said first pattern.

80. The method of claim 79 wherein said second pattern is formed by passing said light through at least a second photomask.

81. The method of claim 80 wherein illuminating said second pattern is performed after said reversing.

82. The method of claim 77 wherein said first photoactive material, first intermediate material, and second intermediate material each comprise nanocrystals.

83. The method of claim 82 wherein said nanocrystals are semiconductor nanocrystals.

84. The method of claim 82 wherein said resist provides etch resistance enhanced at least in part by said nanocrystals.

85. The method of claim 82 wherein said resist provides an index of refraction enhanced at least in part by said nanocrystals.

86. The method of claim 77 wherein at least one of said first photoactive material, first intermediate material, and second intermediate material comprises a semiconductor.

87. The method of claim 77 wherein at least one of said first and photoactive material, first intermediate material, and second intermediate material comprises at least one organic molecule.

88. The method of claim 77 wherein at least one of said first photoactive material, first intermediate material, and second intermediate material comprises at least one inorganic molecule.

89. The method of claim 77 wherein the change in solubility of said resist is at least in part caused by chain scission.

90. The method of claim 77 wherein the change in solubility of said resist is at least in part caused by cross linking.

91. The method of claim 77 wherein the change in solubility of said resist is at least in part caused by acid catalyzed deprotection.

92. The method of claim 77 wherein said resist comprises at least one additive to improve resolution and line edge roughness.

93. The method of claim 92 wherein said additive comprises at least one base to quench at least one photo-generated acid.

94. The method of claim 92 wherein said additive comprise at least one base generator.

95. The method of claim 77 wherein said chemical species leads to changes in said solubility in the presence of a developer.

96. The method of claim 77 wherein said resist further includes a base generator.

97. The method of claim 77 including using immersion lithography.

98. The method of claim 77 wherein said illuminating comprises illuminating with photons of at least one of the following wavelengths: 157 nm, 193 nm, 248 nm, 257 nm, 198 nm, 121 nm and 365 nm.

99. The method of claim 77 wherein said illuminating comprises illuminating with EUV photons.

100. The method of claim 77 further including developing said resist.

101. The method of claim 77 wherein said illuminating comprises illuminating said resist for a first time period, waiting, and then further illuminating said resist for a second time period.

102. The method of claim 101 wherein said illuminating and further illuminating use the same pattern.

103. The method of claim 101, wherein said illuminating and further illuminating use different patterns.

104. The method of claim 101 wherein said illuminating includes passing said photons through an optical system having a resolution limited by diffraction, and
wherein said change in solubility of said resist results in a sub-diffraction limited pattern.

105. The method of claim 77 wherein said illuminating includes passing said photons through an optical system having a resolution limited by diffraction, and
wherein said change in solubility of said resist results in a sub-diffraction limited pattern.

106. The method of claim 77 wherein said illuminating comprises illuminating said resist multiple times separated by waiting times there between.

107. The method of claim 106, wherein all of said multiple illuminations use the same pattern.

108. The method of claim 106 wherein some of said multiple illuminations use different patterns.

109. The method of claim 106 wherein said illuminating includes passing said photons through an optical system having a resolution limited by diffraction, and
wherein said change in solubility of said resist, results in a sub-diffraction limited pattern.

* * * * *